United States Patent [19]
Zhou

[11] Patent Number: 5,760,603
[45] Date of Patent: Jun. 2, 1998

[54] HIGH SPEED PLD "AND" ARRAY WITH SEPARATE NONVOLATILE MEMORY

[75] Inventor: Shidong Zhou, Milpitas, Calif.

[73] Assignee: Xilinx, Inc., San Jose, Calif.

[21] Appl. No.: 729,079

[22] Filed: Oct. 10, 1996

[51] Int. Cl.$^6$ ...................................................... H03K 7/38
[52] U.S. Cl. ................................... 326/40; 340/825.91
[58] Field of Search .................. 326/39, 40; 340/825.91, 340/825.93

[56] References Cited

U.S. PATENT DOCUMENTS

| | | | |
|---|---|---|---|
| 3,651,467 | 3/1972 | De Jean et al. | 340/825.91 |
| 3,760,361 | 9/1973 | Leger et al. | 340/825.91 |
| 4,998,101 | 3/1991 | Trumpp et al. | 340/825.91 |
| 5,214,424 | 5/1993 | Heiduk | 340/825.91 |
| 5,510,730 | 4/1996 | El Gamal et al. | 326/40 |

Primary Examiner—Stephone B. Allen
Assistant Examiner—Richard Roseen
Attorney, Agent, or Firm—Edel M. Young; Gary A. Hecker, Esq.; Hecker & Harriman

[57] ABSTRACT

The invention is a unique high speed Programmable Logic Device ("PLD") AND array with separate nonvolatile memory. The invention utilizes a separate nonvolatile memory to isolate the effect of nonvolatile transistors from the proper operation of the PLD AND array. The invention also results in a substantial increase in the amount of current flowing through transistors charging and discharging the PLD AND array bit lines. This in turn significantly increases the speed of the invention's PLD AND array. Moreover, the invention makes the current charging or discharging the PLD AND array bit lines more predictable. These advantages of the present invention are achieved by a nonvolatile memory that is separate from the AND array itself and also by utilizing NMOS transistors in the AND array instead of using the prior art nonvolatile transistors such as EEPROM transistors in the AND array.

8 Claims, 5 Drawing Sheets

HIGH SPEED PLD "AND" ARRAY WITH SEPARATE NONVOLATILE MEMORY

FIELD OF THE INVENTION

The present invention relates to the field of PLD (Programmable Logic Device) AND arrays.

BACKGROUND ART

PLD (Programmable Logic Device) AND arrays are used to perform both memory and logic functions. A memory function is typically performed by using storage transistors inside the AND array itself. Each storage transistor in the AND array is typically in series with an "enable" transistor that is driven by a word line. The storage transistors are typically nonvolatile memory transistors such as EEPROM or EPROM transistors. Thus, the array can be programmed (hence the name, "Programmable Logic Device") by programming the nonvolatile memory transistors. When a particular word line is selected, turning on a particular enable transistor, the contents of the storage transistor in series with that enable transistor is read.

The logic function is performed by a Boolean operation, such as an AND operation, on the contents of the storage transistors. By connecting the storage transistors (through their respective enable transistors) to a common bit line, the contents of word lines enabled by the storage transistors are effectively "ANDed." Thus, the common bit line is pulled low if any of the storage transistors have a logic 0 stored, i.e. if the threshold of any of the storage transistors is low enough to be turned on during a read operation and the corresponding word line carries a logic 1. Conversely, the bit line remains high only if all of the storage transistors have a logic 1 stored, i.e. if the threshold of all of the storage transistors is high enough so that none is turned on during a read operation or if all enabled word lines carry logic 0.

Thus, the PLD AND array performs a combined memory and logical AND function. If PLD AND arrays contain nonvolatile memory transistors, these nonvolatile memory transistors tend to store analog values, that is, they do not cleanly turn on or off in response to a control signal to the gate.

The prior art PLD AND arrays, and specifically the prior art nonvolatile PLD AND arrays, have several disadvantages: a defective storage transistor renders the entire array non-functional, and specifically with respect to nonvolatile arrays, the transitions of the prior art PLD AND array bit lines are too slow. Moreover, the charge and discharge speed of the prior art PLD AND array bit lines are unpredictable. These disadvantages of the prior art PLD AND arrays are illustrated by discussing a specific example below.

FIG. 1 illustrates a typical prior art PLD AND array. The array is fabricated on a semiconductor substrate such as a silicon substrate. As suggested in FIG. 1, the array comprises a large number of storage cells. Each storage cell comprises two series transistors such as 112a and 114a. Transistor 112a is typically an NMOS transistor which is enabled when Word Line 102a coupled to the gate of that particular transistor is high. Also provided are complementary word lines such as 102b. Transistor 112b is enabled when word line 102b is high, when occurs when word line 102a is low. Thus true and complement signals are available to generate a wide range of combinatorial functions. NMOS transistors 112 are referred to as the "enable" transistors since they enable the detection of what is stored in storage transistors 114. As discussed in more detail below, each storage transistor 114 is a nonvolatile memory transistor such as an Electrically Erasable and Programmable Read Only Memory (EEPROM).

Each storage transistor 114 is coupled in series with its respective enable transistor 112 as shown in FIG. 1. Thus, the drain of each enable transistor 112 is coupled to bit line 104 while the source is coupled to the drain of a respective storage transistor 114 while the source of each storage transistor 114 is coupled to ground 108. The control gate of each nonvolatile storage transistor 114 is driven by read line 106. Bit line 104 thus couples the drains of all enable transistors 112 and read line 106 drives the control gates of all EEPROM storage transistors. Bit line 104 is connected to the input of sense amplifier 110. Output 116 of sense amplifier 110 provides the logic status of the PLD AND array bit line 104 to inverter 118. Output 120 of inverter 118 provides a logical AND value of the row of storage cells that are coupled to bit line 104.

Each storage transistor 114 is typically an EEPROM transistor. A typical EEPROM transistor structure is shown in FIG. 2. As shown in FIG. 2, the typical EEPROM transistor comprises a source 202, a drain 206, a substrate 204, a floating gate 212, a control gate 210, and a region of silicon dioxide 208. In the example shown in FIG. 2, source region 202 and drain region 206 are N type silicon and the substrate 204 is P type silicon. Manifestly, the types of the silicon material can be reversed. Floating gate 212 and control gate 210 are typically made of polycrystalline silicon material. The region of silicon dioxide 208 is used to isolate the floating gate and control gate from each other and also from the silicon surface. Silicon region layer 208 is also used to protect the control gate and floating gate from physical damage from the outside environment.

EEPROM transistors typically operate based on the "Fowler-Nordheim electron tunneling" principle as opposed to the "hot electron" injection principle. Briefly, the hot electron injection method requires a high electrical field in the channel region near the junction with drain 206 to cause a large amount of current (electrons or holes) to flow from the semiconductor 204 to the floating gate 212. The storage and removal of charge (electrons or holes) to and from the floating gate causes a shift in the threshold voltage of the EEPROM, which in turn causes the EEPROM to become "programmed" or "erased." As stated above, EEPROM transistors tend to store analog values rather than clean digital 1's and 0's.

The typical prior art PLD AND array shown in FIG. 1 (using floating gate EEPROMs as shown in FIG. 2) has several disadvantages. If one of the storage transistors 114 is defective, for example due to defects on the silicon wafers, the entire PLD array is unusable. The reason is that when a single storage transistor does not properly function, the logical state of bit line 104 is no longer reliable. For example, if a storage transistor that is supposed to be in a logical 0 state is, because of various defects, in a logical 1 state, output 120 of the PLD AND array may be high instead of being low. Thus, the entire PLD AND array is rendered useless and inoperative.

Another disadvantage is that if storage transistors 114 store intermediate values (instead of digital values), the amount of current flowing through each transistor 114 is limited. The reason is that if the value stored in transistor 114 is midway between a logical 1 and a logical 0, the amount of current flowing through transistor 114 is naturally less than when the value stored is a logical 0. This is because, the threshold voltage of an EEPROM transistor storing a 0 is much lower than the threshold voltage of that EEPROM transistor when storing a analog value of "0.5." Moreover, the control gate voltage (i.e. the voltage of read line 106 in FIG. 1) of the EEPROM transistors cannot be raised too high since this causes "disturbance" in the threshold voltage of the EEPROM transistor.

When the threshold voltage gets above a certain value, charges (electrons or holes) begin to be attracted to the floating gate, thus causing a threshold voltage shift in the EEPROM transistor. This causes an unwanted change in the analog value stored in the EEPROM transistor. Thus, the combination of the fact that the stored value may be an analog value between 0 and 1 (instead of a "hard" 0 or 1) and the fact that the control gate voltage cannot be raised too high, severely limits the amount of current passing through storage transistors 114 of the prior art. The limitation on current passing through transistor 114 results in a slow transition of bit line 104. This is because to charge or discharge bit line 104 requires a certain amount of charge to be removed or added, and that takes more time when the current passing through transistor 114 is limited.

A further disadvantage of the prior art PLD AND array shown in FIG. 1 is that the current charging or discharging of bit line 104 is unpredictable if the values stored in the EEPROM storage transistors are intermediate values (instead of digital values). This is because the charge or discharge current depends upon the values stored in the storage transistors that are coupled to bit line 104. When new values are stored, the discharge and charge current change. This causes an unpredictable change in the amount time that it takes to charge or discharge bit line 104.

Thus, there is need in the art for a PLD AND array which overcomes the above prior art disadvantages of (1) the fatal effect of a defective storage transistor on the entire array; (2) the slow transitions of the prior art PLD AND array bit line; and (3) the unpredictable charge and discharge speed of the prior art PLD AND array bit line.

SUMMARY OF THE INVENTION

The invention is a unique high speed Programmable Logic Device ("PLD") AND array with separate nonvolatile memory. The invention utilizes a separate nonvolatile memory to isolate the effect of defective memory transistors from the proper operation of the PLD AND array. The invention also results in a substantial increase in the amount of current flowing through transistors charging and discharging the PLD AND array bit lines. This in turn significantly increases the speed of the invention's PLD AND array. Moreover, the invention makes the current charging or discharging the PLD AND array bit lines more predictable. These advantages of the present invention are achieved by a nonvolatile memory that is separate from the AND array itself and also by utilizing NMOS transistors in the AND array instead of using the prior art nonvolatile transistors such as EEPROM transistors in the AND array.

DETAILED DESCRIPTION OF THE INVENTION

A high speed Programmable Logic Device ("PLD") AND array with separate nonvolatile memory is described. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Figure 1:
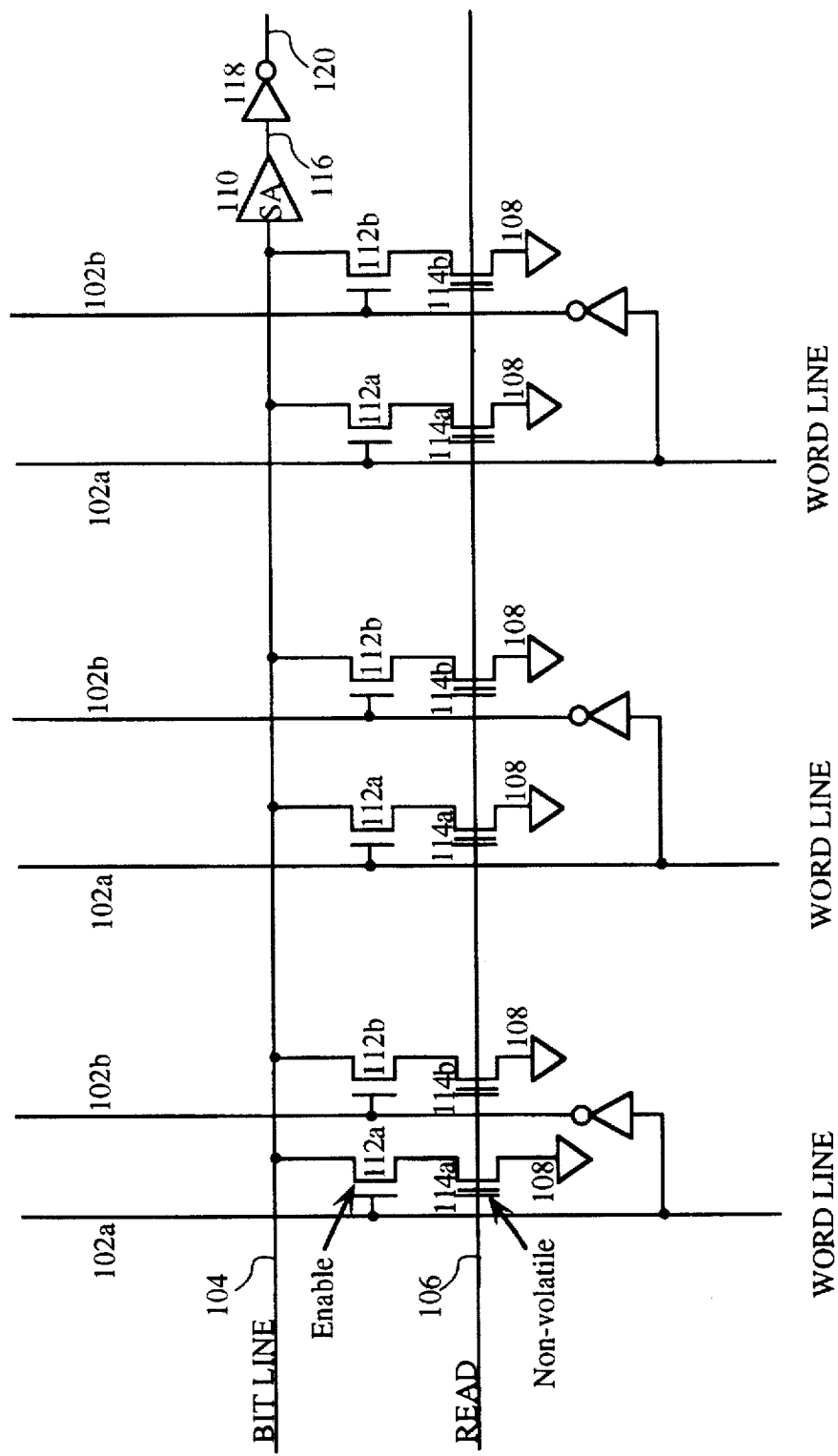
FIG. 1 illustrates a prior art PLD AND array.
Figure 2:
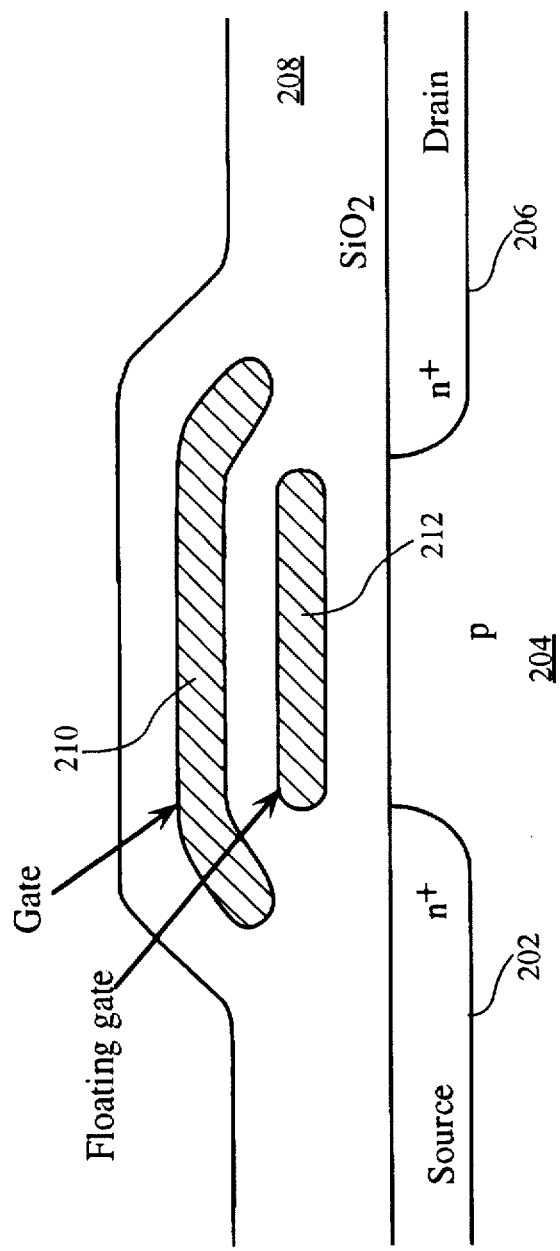
FIG. 2 illustrates the structure of a typical EEPROM transistor used as a nonvolatile memory transistor.

By way of contrast with the present invention, the operation of the prior art PLD AND array shown in FIG. 1 is briefly discussed. Suppose that the prior art PLD AND array shown in FIG. 1 is an array where each storage transistor 114 is an "EEPROM transistor." Each EEPROM transistor 114 is an analog storage structure being used to store digital values. As stated above, storage transistors 114 have thin oxides and operate based on electron (or hole) tunneling current. In operation, a read cycle of the prior art PLD AND array shown in FIG. 1 proceeds as follows. A set of word lines 102 is forced high or low through word line drivers (not shown). The word lines that are high pull down the bit line if their corresponding storage transistors 114 are erased (conductive). Word lines that are low do not pull down bit line 104. Output 116 of sense amplifier 110 is forced high when bit line 104 is pulled low. Thus, output 116 of sense amplifier 110 is forced high, and in turn causes output 120 of inverter 118, i.e. the final output of the PLD AND array to go low.

Conversely, bit line 104 is forced high if all of the storage transistors 114 in a row of enable transistors 112 represent a logical 1, i.e. if all of the storage transistors 114 are in the "programmed" state. Output 116 of sense amplifier 110 is forced low when bit line 104 is pulled high. Thus, output 116 of sense amplifier 110 is forced low when all of the storage transistors 114 in a given row are programmed. This in turn causes output 120 of inverter 118, i.e. the final output of the PLD AND array to go high. Thus, if all of the storage transistors 114 represent a logical 1 (i.e. are programmed), the output of the PLD AND array is forced high.

Figure 3:
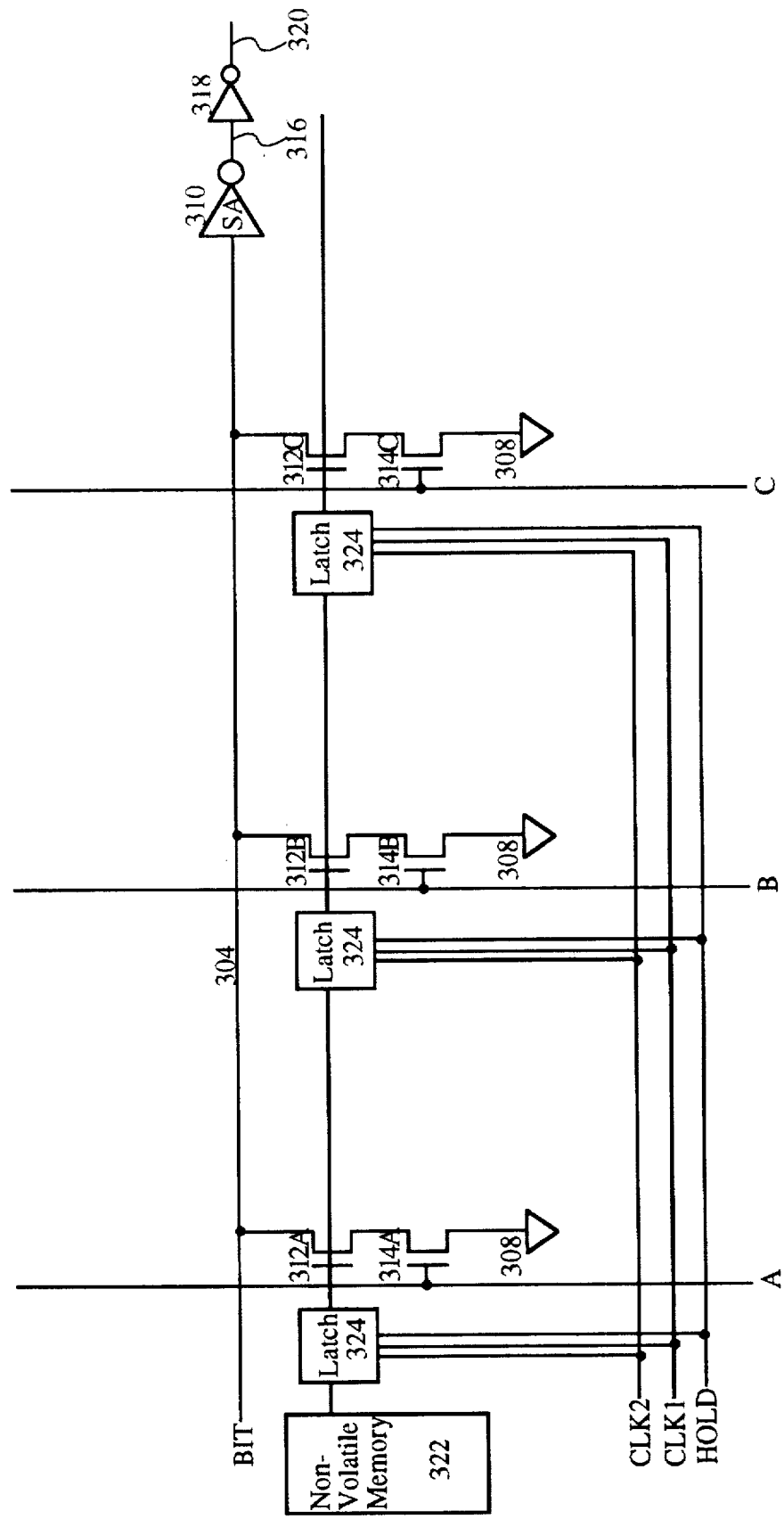
FIG. 3 illustrates the invention's PLD AND array with a separate nonvolatile memory.
Figure 4:
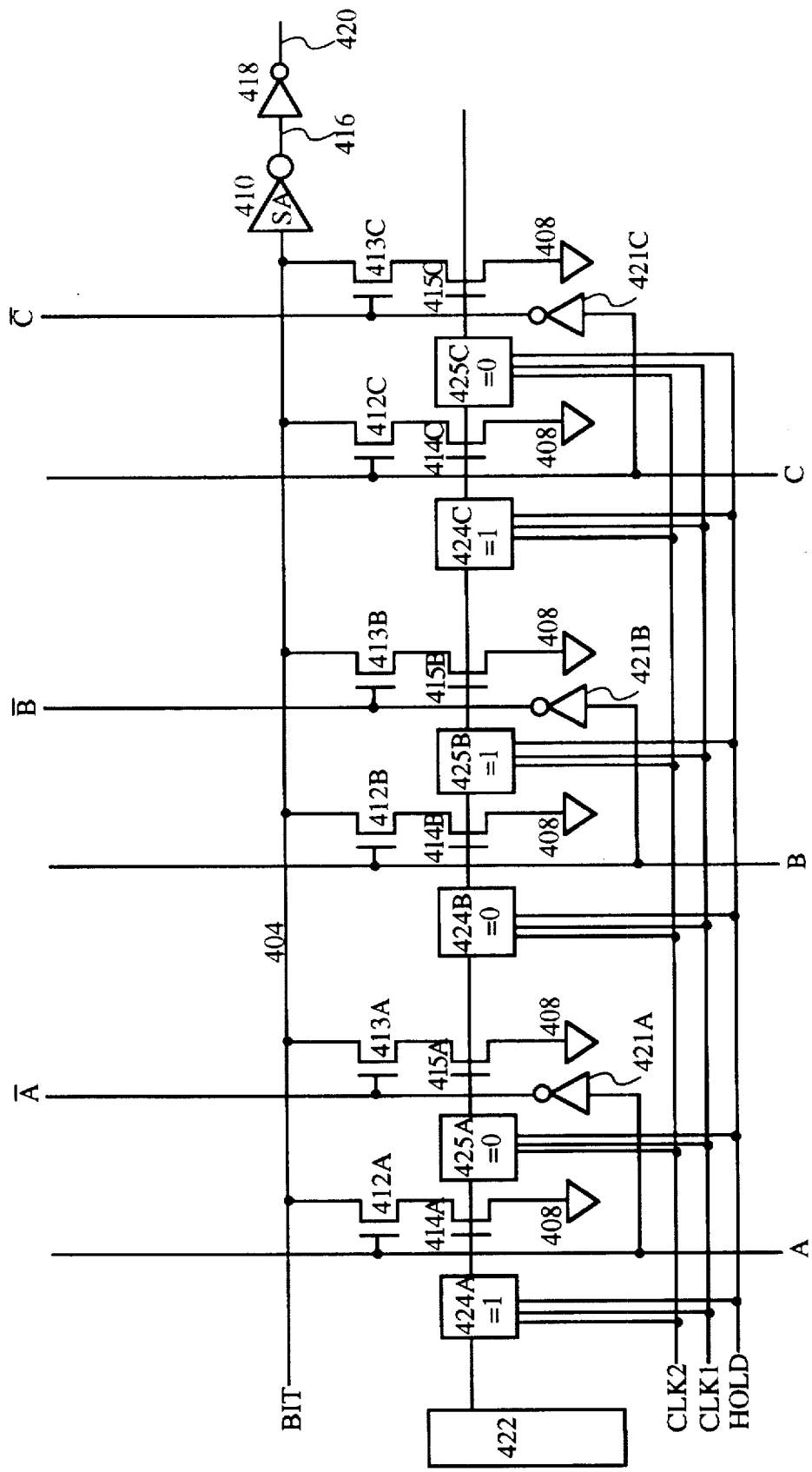
FIG. 4 illustrates another embodiment of the invention's PLD AND array with a separate nonvolatile memory.

FIGS. 3 and 4 illustrate two embodiments of the invention's PLD AND array. As shown in FIG. 3, the array comprises a large number of cells each comprising transistors 312 and 314, a number of latches 324, and a nonvolatile memory 322. Transistors 312 and 314 are typically NMOS transistors which are enabled when word line A, B, or C coupled to the gate of a particular transistor 314 is high. NMOS transistors 314 are referred to as the "enable" transistors since they enable the detection of what is stored in the nonvolatile memory 322. Nonvolatile memory 322 typically comprises an array of EEPROM transistors (not shown).

Each transistor 312A, 312B, 312C is coupled in series with a respective enable transistor 314A, 314B, 314C as shown in FIG. 3. The drain of each transistor 312 is coupled to bit line 304 while its source is coupled to the drain of a respective enable transistor 314. The drain of each enable transistor 314 is coupled to the source of a respective transistor 312 while the source of each enable transistor 314 is coupled to ground 308. The gate of each series transistor 314 is driven by a latch 324. Each latch 324 holds a value shifted through a shift register from nn-volatile memory 322. Clock signals CLK1 and CLK2 and hold signal HOLD cause latches 324 to shift the stored data supplied by nonvolatile memory 322 into position from where the data are applied to the gates of transistors 312. Thus, data from nonvolatile memory 322 drives the gates of all transistors 312. Bit line 304 is connected to the input of sense amplifier 310. Output 316 of sense amplifier 310 provides the logic status of the PLD AND array bit line 304 to inverter 318. Output 320 of inverter 318 provides the logical AND value of the EEPROM transistors being read from nonvolatile memory 322.

Figure 5:
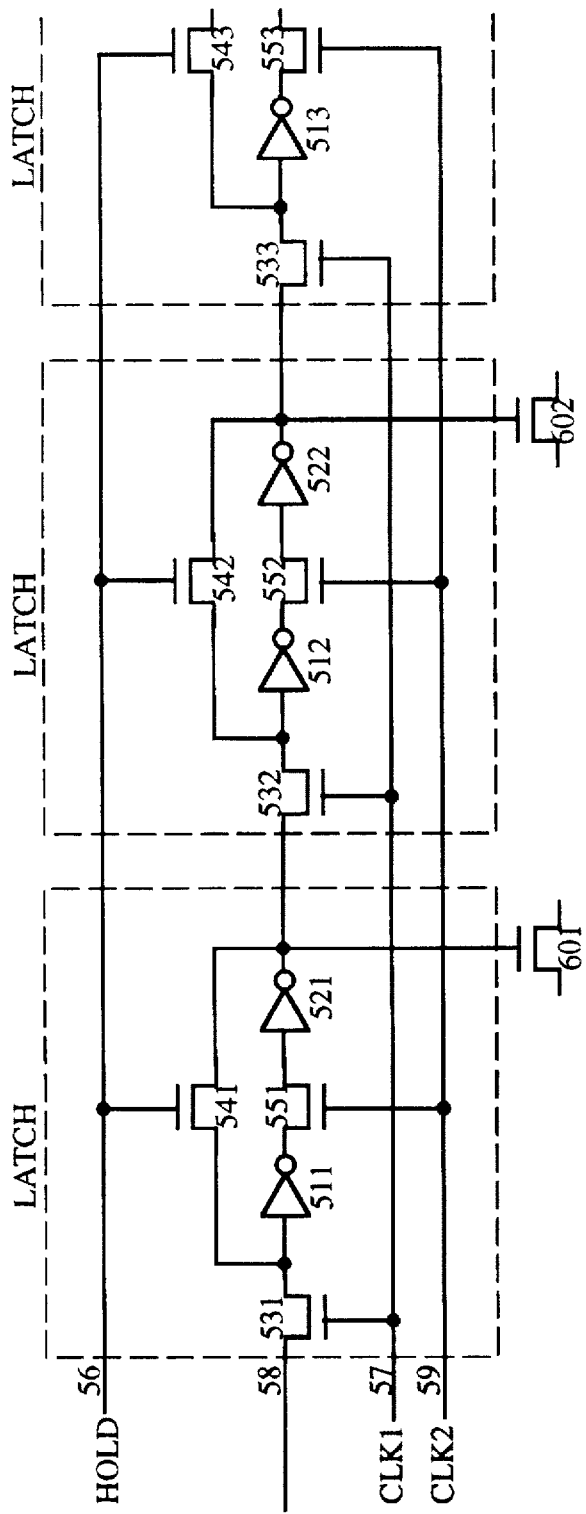
FIG. 5 illustrates a prior art shift register with latches suitable for use in the structures of FIGS. 3 and 4.

In operation, data is read from the EEPROM transistors (not shown) in the nonvolatile memory 322. The data read from the nonvolatile memory is then shifted into latches 324. FIG. 5 shows a shift register structure usable for shifting data into latches 324. The structure of FIG. 5 is shown by Freeman in FIG. 5 of U.S. Pat. No. Re. 34,363 and discussed at col. 6 line 23 to col. 8 line 14 of Freeman. Labels in FIG. 5 here are similar to those used in FIG. 5 of the Freeman patent. Briefly, during shifting, HOLD is low, so the feedback path through transistors 541, 542, and 543 is disabled. Signals CLK1 and CLK2 are alternately brought high in a non-overlapping pattern. When CLK1 goes high, data on input line 58 and temporarily stored in inverters 521, 522, and 523 are applied to inverters 511, 512, and 513, etc. CLK1 is then brought low and CLK2 is brought high, which causes data in inverters 511, 512, and 513 to be applied to inverters 521, 522, and 523, etc. Thus, a data value is shifted to the next latch upon each cycle of CLK1 or CLK2. When data have been shifted into position, CLK2 is held high, CLK1 is held low, and HOLD is brought high to form feedback loops, latching each data value into its respective position. These values are then available to drive pass devices such as 601 and 602. When a particular set of word lines 302 are asserted high, enable transistors 314 provide a path to ground for transistors 312. If the gate of a particular transistor 312 is high, and its associated word line 302 is high, bit line 304 is pulled low. This in turn causes output 316 of sense amplifier 310 to go high and causes output 320 of the PLD AND array of the present invention to go low.

The invention's PLD AND array overcomes the prior art's disadvantages in the following manner. First, both transistors 312 and 314 are NMOS transistors that do not themselves store values. As discussed above, when the prior art EEPROM transistor in a PLD AND array stores an intermediate value, for example, a value of 0.5 volts, the threshold voltage of the EEPROM transistor is such that the current flow through the EEPROM transistor is limited. Moreover, in the prior art PLD AND arrays, the limited current flow cannot be increased by simply increasing the control gate voltage of the EEPROM transistor since this disturbs the finely tuned charge on the floating gate. Since both transistors 312 and 314 in the present invention are NMOS transistors, their threshold voltages are predetermined. Typically the threshold voltage for an NMOS transistor operating with a 5 V power supply is approximately 1.0 volt. Thus, if the gate of transistor 312 is set high based on the data in its respective latch 324, transistor 312 is turned on "hard." In other words, the current flow through transistor 312 is high as intended. Thus, the current limiting effect of an intermediate value stored in a EEPROM transistor inside the nonvolatile memory 322 is isolated. In other words, an intermediate but logically correct value stored in nonvolatile memory 322 produces a clear digital value in latch 324. Moreover, a general increase in the gate voltages of NMOS transistors 312 (for example, by increasing the power supply voltage) substantially increases the current flow through the NMOS transistors without an unwanted change in the threshold voltage of the NMOS transistors. This is because the NMOS transistors 312 do not have a floating gate, and their threshold voltage value is set at the time of fabrication and does not change during operation of the PLD AND array.

A related prior art problem of unpredictability of the current flow is also overcome in the present invention. As discussed above, in the prior art, a slight change in the intermediate level stored in EEPROM transistor 114 (FIG. 1) necessarily resulted in a variation in the threshold voltage of that EEPROM transistor. Variation in the threshold voltage in turn resulted in a change in the current flow through the EEPROM transistor. Thus, depending on the intermediate level stored in the EEPROM transistors coupled to bit line 104 (FIG. 1) the current charging or discharging the bit line would vary. In the present invention, the threshold voltage of NMOS transistor 312 does not vary. Accordingly, the variation in the current flow through NMOS transistor 312 is very small. Accordingly, the current charging or discharging bit line 304 is much more predictable than the charge or discharge current in the prior art.

Another disadvantage of the prior art is also overcome by the invention's PLD AND array. As discussed above, in the prior art, if a single storage transistors 114 (FIG. 1) is defective (for example, due to fabrication defects), the entire array is rendered non-operational. In the present invention, even if a number of EEPROM transistors in nonvolatile memory 322 are defective, the PLD AND array can still function properly. The reason is that the effect of such defects can be isolated from the PLD AND array itself. This can be done by various methods. For example, the defective transistors in the nonvolatile memory 322 can be avoided and not accessed when forming a bit stream to shift into latches 324. In other words, the known defects can be avoided, while the remainder of the nonvolatile memory functions and, of course the entire PLD AND array functions in a normal manner. Alternatively, known memory redundancy techniques can be used in nonvolatile memory array 322. The faulty memory can then be bypassed by firmware techniques such as shifting the contents of redundant memory to replace the contents of the defective transistors. As yet another alternative, hardware redundancy and error correction logic can be utilized. For example, the entire row or column in memory 322 containing a defective transistor can be bypassed by rewiring the on-chip logic by blowing identified fuses during wafer testing and package assembly. In any event, the invention results in isolating the effect of defective memory transistors from proper functioning of the PLD AND array. As such, the PLD AND array is not rendered non-operational because of defects in a few nonvolatile memory transistors.

Another embodiment of the present invention is illustrated in FIG. 4. FIG. 4 shows nonvolatile memory module 422 as a separate memory module from the PLD AND array. The PLD AND array comprises a number of series pairs of NMOS transistors coupled to bit line 404. The series pairs shown in FIG. 4 are transistor pairs 412A and 414A, 413A and 415A, 412B and 414B, 413B and 415B, 412C and 414C, 413C and 415C. As shown in FIG. 4, the sources of transistors 414A, 415A, 414B, 415B, 414C, and 415C are coupled to ground 408. The drains of transistors 412A, 413A, 412B, 413B, 412C, and 413C are coupled to bit line 404. Latches 424A, 425A, 424B, 425B, 424C, and 425C drive the gates of transistors 414A, 415A, 414B, 415B, 414C, and 415C respectively. These latches receive their data during clocks CLK1 and CLK2 from nonvolatile memory module 422 as discussed above in connection with FIG. 5. Signals A, B, and C drive the gates of transistors 412A, 412B, and 412C respectively. Inverters 421A, 421B, and 421C drive the gates of transistors 413A, 413B, and 413C with signals $\overline{A}$, $\overline{B}$, and $\overline{C}$ respectively. Signals $\overline{A}$, $\overline{B}$, and $\overline{C}$ are the complements of signals A, B, and C respectively. Sense amplifier 410 is coupled to bit line 404 and detects transitions on the bit line. Inverter 418 inverts the output of sense amplifier 410, thus output 420 of the PLD AND array has the same polarity as bit line 404.

The operation of the embodiment of the invention shown in FIG. 4 is similar to the embodiment shown in FIG. 3. Bit line 404 provides a logical function of input signals A, B, and C and their complements depending on the contents of latches 424A, 425A, 424B, 425B, 424C, and 425C. For example, suppose that nonvolatile memory module 422 provides the data stream 100110 to latches 424A, 425A, 424B, 425B, 424C, and 425C respectively. Thus, transistors 414A 415B, and 414C will be "on" (or conductive), while transistors 415A, 414B, and 415C will be "off" (or non-conductive). Thus, when and only when signals A, $\overline{B}$, and C are low (when B is high), no discharge path is provided for bit line 404, and bit line 404 will be high. In other words, only input values A=0, B=1, and C=0 will produce a logical 1 output on line 420. One advantage of the embodiment shown in FIG. 4 is that various Boolean combinations of input signals A, B, and C can be provided on output line 420 depending on the nonvolatile memory data stream that is applied to latches 424A, 425A, 424B, 425B, 424C, and 425C. For example, output 420 can be an AND function of input signals A, B, and C; a NAND function of input signals A, B, and C; a NOR function of input signals A, B, and C; or alternatively any other function, such as an AND of A', B, and C' as illustrated in the above example.

Although the invention has been described with reference to certain embodiments, it is appreciated by those skilled in the art that changes in various details may be made without departing from the invention defined in the appended claims. For example, in one embodiment the nonvolatile memory array can be comprised of ROM or EPROM instead of EEPROM transistors. In another embodiment, the array transistors can be PMOS, or transistors other than MOS transistors (such as bipolar transistors).

I claim:

1. A PLD AND array comprising:

a programmable nonvolatile memory module;

a latch coupled to said programmable nonvolatile memory module for storing data read from said programmable nonvolatile memory module; and an array of two transistors coupled in series to a bit line;

one of said two transistors being coupled to and driven by said latch.

2. The PLD AND array of claim 1 wherein said latch is part of a shift register loaded by a clock signal.

3. The PLD AND array of claim 1 wherein said two transistors coupled in series comprise two NMOS transistors.

4. The PLD AND array of claim 1 wherein said programmable nonvolatile memory module comprises EEPROM transistors.

5. The PLD AND array of claim 1 wherein said bit line is coupled to a sense amplifier.

6. The PLD AND array of claim 1 wherein said programmable nonvolatile memory module includes redundant memory transistors.

7. The PLD AND array of claim 1 wherein a second one of said two transistors is coupled to and driven by a word line.

8. The PLD AND array of claim 1 wherein the current flowing through said two transistors coupled in series is substantially uniform.

* * * * *